United States Patent [19]
Bakker

[11] Patent Number: 5,272,388
[45] Date of Patent: Dec. 21, 1993

[54] HIGH-YIELD METHODS FOR PROGRAMMING ANTIFUSES

[75] Inventor: Gregory W. Bakker, Sunnyvale, Calif.

[73] Assignee: Actel Corporation, Sunnyvale, Calif.

[21] Appl. No.: 895,620

[22] Filed: Jun. 9, 1992

[51] Int. Cl.$^5$ .................. H02H 7/20; G11C 17/00
[52] U.S. Cl. .................. 307/202.1; 365/96; 437/172
[58] Field of Search .......... 307/202.1, 465; 365/96, 365/225.7; 437/170, 172; 257/530

[56] References Cited

U.S. PATENT DOCUMENTS

| 5,008,855 | 4/1991 | Eltoukhy et al. | 365/96 |
| 5,126,282 | 6/1992 | Chiang | 437/172 |
| 5,134,457 | 7/1992 | Hamdy | 257/748 |
| 5,194,759 | 3/1993 | El-Ayat | 307/468 |

Primary Examiner—Edward P. Westin
Assistant Examiner—Andrew Sanders
Attorney, Agent, or Firm—Kenneth D'Alessandro

[57] ABSTRACT

A method for programming an antifuse of a selected technology type comprises the steps of (1) applying a preselected number of programming pulses to the antifuse at a voltage less than the maximum voltage at which antifuses of that selected technology type are known to program, (2) testing to see if the antifuse has been programmed, (3) increasing the programming voltage by a preselected increment and applying the preselected number of programming pulses to the antifuse if the antifuse has not been programmed, and (4) repeating steps (2) and (3) until the antifuse has been programmed. The antifuse may be identified as defective if it does not program after a selected number of attempts.

24 Claims, 2 Drawing Sheets

HIGH-YIELD METHODS FOR PROGRAMMING ANTIFUSES

BACKGROUND OF THE INVENTION

1. Field Of The Invention

The present invention relates to user-programmable antifuse devices. More particularly, the present invention relates to methods for programming antifuse devices.

2. The Prior Art

All antifuse processes produce antifuses with programming voltages that are distributed over a range of voltages (e.g. 8–13 volts). Typical programming algorithms apply a programming voltage ($V_{pp}$) that is greater than the anticipated maximum programming voltage in order to assure the desired antifuse is programmed (e.g. $V_{pp}=13.5$ volts).

Utilization of this typical prior art antifuse programming regime is likely to have a negative impact on antifuse programming yield. The reason is that antifuses which are intended to be left unprogrammed may become overstressed and be thereby weakened or inadvertently programmed.

It is an object of the present invention to reduce the probability of inadvertent programming of any antifuse other than the intended one.

It is a further object of the present invention to reduce leakage current through unprogrammed fuses during the programming cycle so that leakage load on the programming circuit is reduced and circuit nodes that are floating during programming will drift less in voltage and more slowly in time.

Yet another object of the present invention is to allow the use of antifuse elements with a wider programming voltage and leakage characteristic than would be possible without the present invention.

A further object of the invention is to reduce, during the programming period, the stress introduced on antifuses which will not be programmed.

BRIEF DESCRIPTION OF THE INVENTION

According to a first aspect of the present invention, a method for programming an antifuse of a selected technology type comprises the steps of (1) applying a preselected number of programming pulses to the antifuse at a preselected voltage having a magnitude less than the maximum voltage at which antifuses of that selected technology type are known to program, (2) testing to see if the antifuse has been programmed, (3) increasing the programming voltage by a preselected increment and applying the preselected number of programming pulses to the antifuse if the antifuse has not been programmed, and (4) repeating steps (2) and (3) until the antifuse has been programmed.

According to another aspect of the present invention, the antifuse to be programmed may be identified as defective if it has not programmed after a predetermined number of attempts.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. The present invention will be disclosed in terms of illustrative embodiments applied to metal-to-metal antifuses employing amorphous silicon antifuse layers and to antifuses employing ONO dielectric sandwich antifuse layers, but those of ordinary skill in the art will recognize that the principles of the present invention apply equally to antifuses fabricated using other technologies. The method of the present invention is particularly useful for antifuse processes which produce antifuses which exhibit normally-distributed programming voltages, and where individual dies exhibit a standard deviation much less than the overall process.

Figure 1:
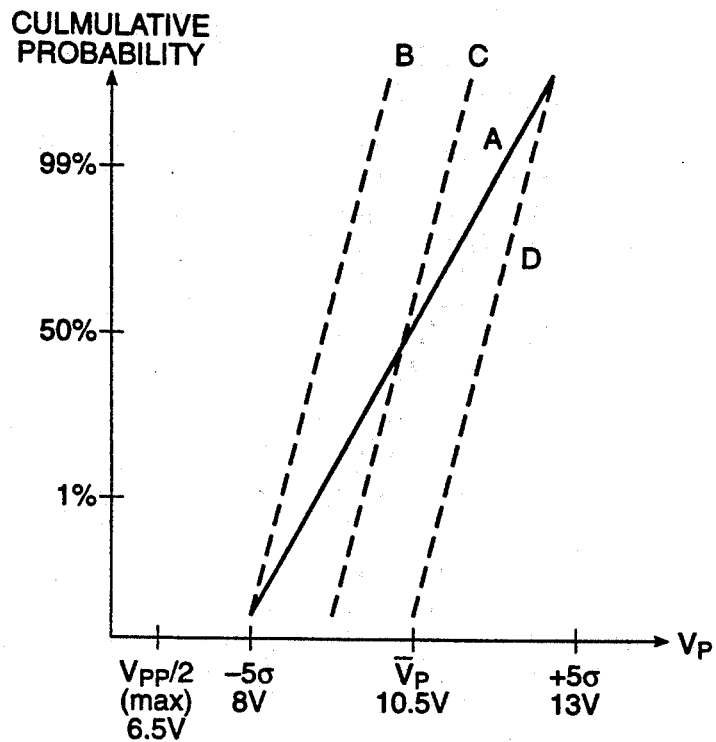
FIG. 1 is a graph showing the distribution of actual programming voltages for a population of antifuses, where curve A is for the overall process, and curves B-D are for individual die.

Referring first to FIG. 1, a curve of the distribution of programming voltages for a population of metal-to-metal antifuses, it can be seen that the metal-to-metal antifuse process is expected to have a range of programming voltages as shown by curve A. Curve A shows that the entire population of metal-to-metal antifuses experiences a programming voltage spread of about $\pm 5\sigma$. Compared to the overall process, individual die should have a smaller programming-voltage-spread $\sigma$ as indicated by curves B, C, and D. The mean for the individual die may be different than the overall process mean.

Figure 2:
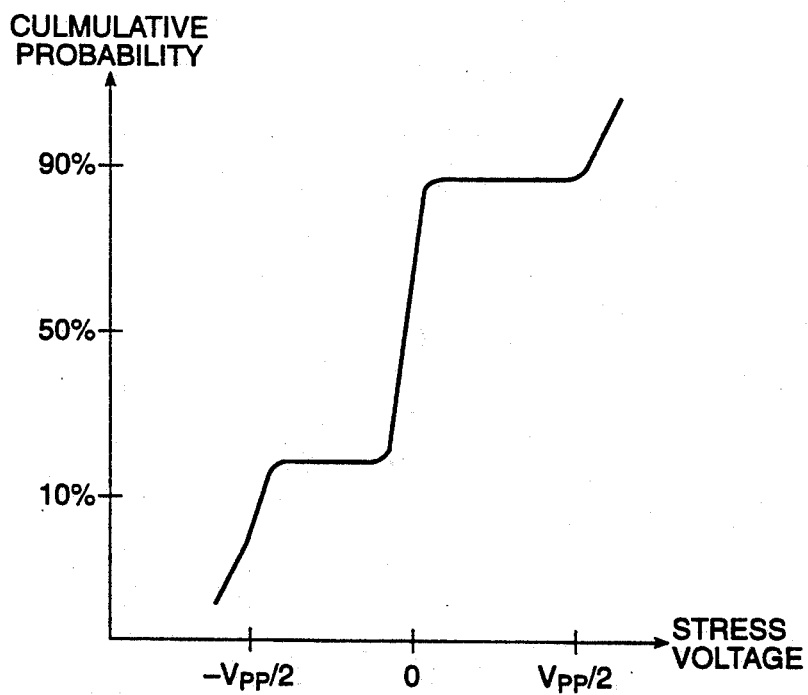
FIG. 2 is a graph showing an estimation of what the stress distributions might be for antifuses not being programmed.

During programming of selected antifuses in an integrated circuit or other structure including a plurality of antifuses, all antifuses not being programmed reach a steady state voltage which is proportional to the programming voltage $V_{pp}$, due to current balancing of antifuse leakages and other leakage. Prior to applying $V_{pp}$, it is common to precharge all antifuse leakages and other leakages. Prior to applying $V_{pp}$, it is common to precharge all antifuse lines to $V_{pp}/2$. Then when VPP is applied, selected nodes are pulled up to $V_{pp}$ while other nodes are pulled to ground. FIG. 2 is a graph showing an estimation of what the stress distributions might be for the antifuses not being programmed.

Most unprogrammed antifuses are not stressed. Some are stressed at voltage near $V_{pp}/2$. Programming the wrong antifuse will occur only if the tails of the curve of FIG. 2 overlap the lower tail of the curve of FIG. 1. The tails of the curve of FIG. 2 broaden with higher antifuse leakage. According to the common industry method for programming antifuses, the maximum available programming voltage is applied to all antifuses ($V_{pp}=V_{ppmax}$), to assure that all antifuses can be programmed. This method is characterized by the inherent risk that the curves of FIG. 1 and FIG. 2 might overlap, and thus that an unintended antifuse may become programmed.

According to the present invention, a method for programming antifuses includes the steps of (1) applying a preselected number of programming pulses to the antifuse at a preselected voltage having a magnitude less than the maximum voltage at which antifuses of that selected technology type are known to program, (2) testing to see if the antifuse has been programmed, (3) increasing the programming voltage by a preselected increment and applying the preselected number of programming pulses to the antifuse if the antifuse has not been programmed, and (4) repeating steps (2) and (3) until the antifuse has been programmed.

Figure 3:
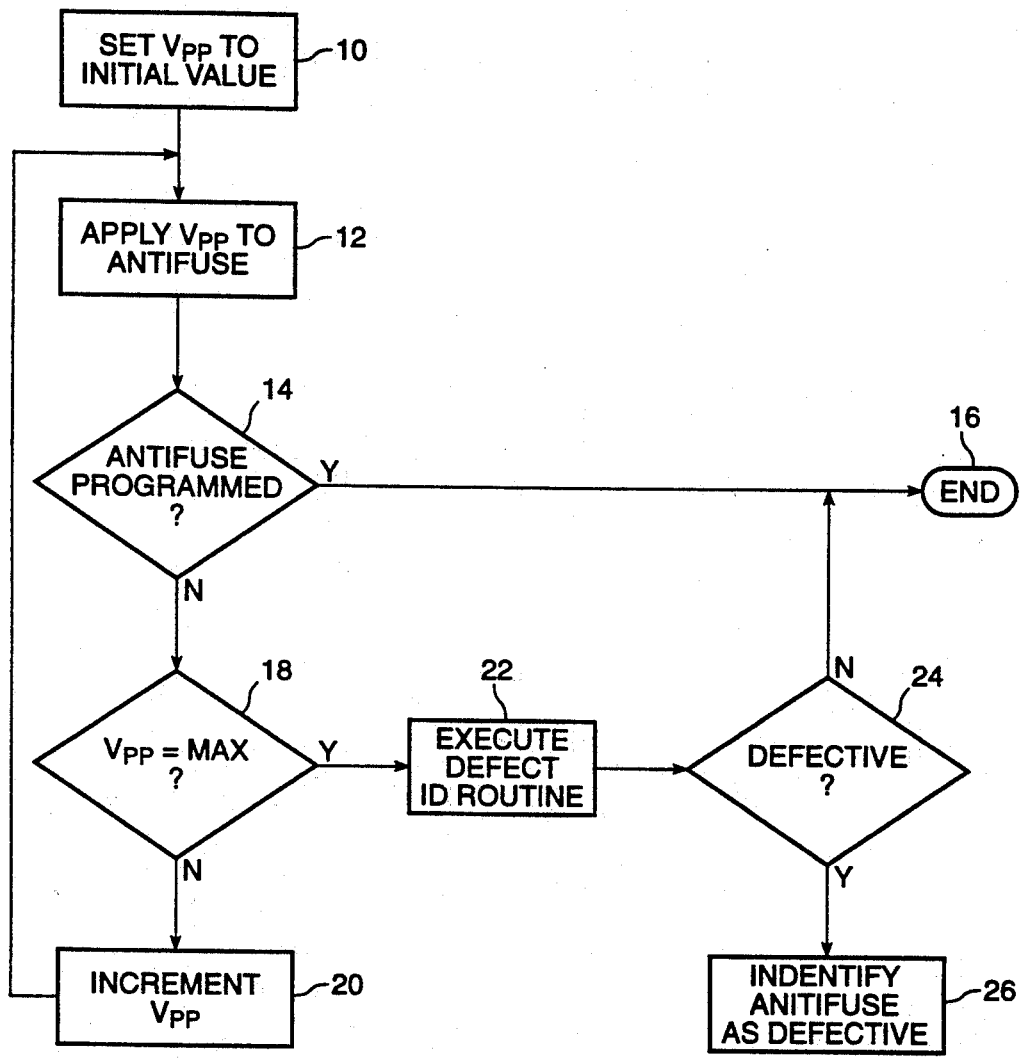
FIG. 3 is a flow diagram illustrating a presently preferred embodiment of the invention.

The present invention is illustrated in FIG. 3, a flow diagram of the method according to a presently preferred embodiment of the invention. First, at step 10, the programming voltage is set to an initial value lower than the maximum value specified for the antifuses made by the particular process. Absent a compelling criticality which would require that the initial value be set at the minimum specified programming voltage for such antifuses, the initial value may be set at about the mean value of programming voltage for such devices.

Next, at step 12, all antifuse nodes are precharged to $V_{PP}/2$ and the programming voltage is then applied to the antifuse to be programmed. Next, at step 14, the antifuse is tested to see if it has been programmed. If the antifuse has been successfully programmed, the method terminates at step 16.

The steps of setting up a programming voltage value generally, applying the programming voltage to an antifuse, and testing the antifuse to determine whether it has been successfully programmed are well known in the art. The prior art has, however, focussed on applying higher programming voltages. The present invention teaches starting the programming process with lower voltages.

If the antifuse has not been successfully programmed, it is determined whether the programming voltage has been set to its maximum value at step 18. If not, the programming voltage is incremented at step 20. Step 20 may conditionally and variably increment $V_{pp}$ depending on factors such as the number of pulses applied at the present $V_{pp}$, the present value of $V_{pp}$, or programming conditions experienced for previously-programmated antifuses. Step 12 is then repeated.

According to another aspect of the present invention, if the maximum programming voltage has been reached, a final programming attempt/defect identifying routine is implemented at step 22. If, at step 24, the results indicate that the antifuse has been programmed, the method terminates at step 16. If, at step 24, the results indicate that the antifuse is defective, the antifuse is identified as defective at step 26.

According to another aspect of the present invention illustrated at steps 22-26 of FIG. 3, the antifuse to be programmed may be identified as defective under certain conditions. For example, an amorphous silicon antifuse may be identified as defective after the programming voltage has been incremented to the maximum programming voltage value specified for the process and the antifuse has not programmed. In this case, step 18 may be used as the defective-antifuse-identifying step and the positive response to that step may be used to trigger step 26.

In contrast, because of the difference in the physical mechanisms involved in ONO antifuse programming, an antifuse having an ONO antifuse material may be identified as defective after a predetermined number of attempts have been made to program it at the maximum programming voltage value specified for the process and the antifuse has not programmed. As many as 60,000 attempts have been used, and larger numbers of attempts are possible. As presently preferred, about 10,000 attempts to program at the specified maximum programming voltage for the process may be made before identifying the antifuse as defective. Therefore, as presently preferred, a positive response at step 18 triggers 10,000 attempts to program at the maximum programming voltage value interleaved with testing to determine if the antifuse programmed. Those of ordinary skill in the art will recognize that larger numbers of attempts may be made, i.e., 100,000 could be employed, subject to throughput considerations. If programming is successful, step 24 returns negative and the method terminates at step 16. If programming is unsuccessful, step 24 returns positive and the method terminates at step 26.

According to the present invention, the initial value of programming voltage $V_{pp}$ is set to a lower value. In most instances, this lower value may be the mean value at which antifuses of the type under consideration will program. In some cases, it may be advisable to set this initial programming voltage at the minimum value at which the antifuses of the type used will program.

Initial programming voltages may be determined at the sorting/testing step of manufacturing. A number of test antifuses could be programmed to determine the die programming voltage mean and sigma, by using the present programming method. This result may then be used to determine the initial programming voltage, or reject the die if the parameters are unacceptable.

Antifuses which employ amorphous silicon antifuse materials and are fabricated according to a typical fabrication process may have programming voltages in the range of from a minimum of about 9 volts to a maximum of about 13 volts. Typical programming pulse widths are in the range of from about 100 nanoseconds to 1 millisecond, and may typically be around 10 microseconds. Since amorphous silicon typically exhibits little time dependence to breakdown, relatively large incremental increase steps, i.e., about 0.1 volts may be employed. Antifuses which employ ONO antifuse materials and are fabricated according to a typical fabrication process may have programming voltages in the range of from a minimum of about 14 volts to a maximum of about 18 volts. Typical programming pulse widths are in the range of from about 50 microseconds to 100 milliseconds, and may typically be around 500 microseconds. Since ONO antifuse materials typically exhibit a time dependence to breakdown, relatively small incremental increase steps, i.e., about 0.01 volts may be employed.

Several advantages are obtained by employing the method of the present invention. First, the margin between $V_{pp}/2$ and the minimum programming voltage is increased. Die which have programming voltage ranges such as shown at curve B of FIG. 1 will not need $V_{pp} = V_{ppmax}$ for any antifuses. In fact, for the die yielding the curve B data, $V_{pp} < 10.5$ volts for all antifuses. In this case, $V_{pp}/2$ is 5.25 volts, which allows Vpmin-$V_{pp}/2 = 2.75$ volts margin for drift. Without use of the present method,, $V_{pp} = 13$ volts and $V_{pp}/2 = 6.5$ volts, leaving only 1.5 volt margin. Using the method of the present invention greatly reduces the chance that another fuse will reach its minimum programming voltage. Die with programming voltage ranges such as shown in curve D of FIG. 1 will need to occasionally use $V_{pp} = V_{ppmax}$, but the tails in FIG. 2 will not cross the bottom of distribution D. Die with higher programming voltage ranges will generally have lower leakage.

Many antifuses not being programmed are connected to the programming path and are stressed at approximately $V_{pp}/2$. Lowering the programming voltage reduces unprogrammed fuse leakage and total programming path current. This permits relaxation of design constraints and increases settling time of floating nodes.

Use of the method of the present invention permits programming of antifuses with a wider margin of programming voltages than do prior art methods. It also reduces the amount of stress on unprogrammed antifuses. Finally, since $V_{pp}$ is reduced, it provides an additional process margin for voltage breakdown of transistors on the integrated circuit.

Numerous obvious variations of the method disclosed herein are possible and are considered to be equivalent to the methods disclosed herein. For example, the programming voltage could be continously ramped up while sensing for programming. Those of ordinary skill in the art will realize that the bias applied to antifuses to remain unprogrammed must to be concomitantly adjusted.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for programming an antifuse of a selected technology type fabricated by a particular fabrication process, said method comprising the steps of:
   (1) applying a preselected number of programming pulses to said antifuse at an initial programming voltage having a magnitude less than the maximum voltage at which antifuses of that selected technology type are known to program;
   (2) testing to determine whether said antifuse has been programmed;
   (3) increasing the programming voltage by a preselected increment and applying the preselected number of programming pulses to the antifuse if the antifuse has not been programmed; and
   (4) repeating steps (2) and (3) until the antifuse has been programmed.

2. The method of claim 1 wherein said preselected number of pulses is one.

3. The method of claim 1 wherein said preselected increment is between about 0.001 and 1 volt.

4. The method of claim 1 wherein said programming pulses have a duration of about 100 nsec and 100 msec.

5. The method of claim 1 wherein said initial programming voltage is the minimum voltage at which said antifuses fabricated by said particular fabrication process are specified to program.

6. The method of claim 1 wherein said initial programming voltage is the mean voltage at which said antifuses fabricated by said particular fabrication process are specified to program.

7. The method of claim 1 further including the step of identifying said antifuse as defective if it has failed to program after a selected number of repetitions of steps (2) and (3).

8. The method of claim 7 wherein said selected number of repetitions of steps (2) and (3) is between about 1 and 100,000.

9. A method for programming an antifuse having an amorphous silicon antifuse layer fabricated by a particular fabrication process, said method comprising the steps of:
   (1) applying a preselected number of programming pulses to said antifuse at an initial programming voltage having a magnitude less than the maximum voltage at which antifuses fabricated by said particular fabrication process are known to program;
   (2) testing to determine whether said antifuse has been programmed;
   (3) increasing the programming voltage by a preselected increment and applying the preselected number of programming pulses to the antifuse if the antifuse has not been programmed; and
   (4) repeating steps (2) and (3) until the antifuse has been programmed.

10. The method of claim 9 wherein said preselected number of pulses is one.

11. The method of claim 9 wherein said preselected increment is about 0.1 volt.

12. The method of claim 9 wherein said programming pulses have a duration of about 10 $\mu$sec.

13. The method of claim 9 wherein said initial programming voltage is the minimum voltage at which antifuses fabricated by said particular fabrication process are specified to program.

14. The method of claim 9 wherein said initial programming voltage is the mean voltage at which antifuses fabricated by said particular fabrication process are specified to program.

15. The method of claim 9 including the step of identifying said antifuse as defective if it has failed to program after a selected number of repetitions of steps (2) and (3).

16. The method of claim 15 wherein said selected number of repetitions of steps (2) and (3) is the number required to increment the programming voltage to the maximum voltage at which antifuses fabricated by said particular fabrication process are specified to program.

17. A method for programming an antifuse having an ONO dielectric sandwich antifuse layer fabricated by a particular fabrication process, said method comprising the steps of:
   (1) applying a preselected number of programming pulses to said antifuse at an initial programming voltage having a magnitude less than the maximum voltage at which antifuses fabricated by said particular fabrication process are known to program;
   (2) testing to determine whether said antifuse has been programmed;
   (3) increasing the programming voltage by a preselected increment and applying the preselected number of programming pulses to the antifuse if the antifuse has not been programmed; and
   (4) repeating steps (2) and (3) until the antifuse has been programmed.

18. The method of claim 17 wherein said preselected number of pulses is one.

19. The method of claim 17 wherein said preselected increment is about 0.01 volt.

20. The method of claim 17 wherein said programming pulses have a duration of about 500 $\mu$sec.

21. The method of claim 17 wherein said initial programming voltage is the minimum voltage at which antifuses fabricated by said particular fabrication process are specified to program.

22. The method of claim 17 wherein said initial programming voltage is the mean voltage at which antifuses fabricated by said particular fabrication process are specified to program.

23. The method of claim 17 including the step of identifying said antifuse as defective if it has failed to program after the programming voltage has been incremented to the maximum voltage at which antifuses fabricated by said particular fabrication process are known to program and a predetermined number of programming pulses have been applied at that voltage.

24. The method of claim 17 wherein said predetermined number of programming pulses is about 1,000.

* * * * *